United States Patent
Stamm et al.

(10) Patent No.: US 11,964,921 B2
(45) Date of Patent: Apr. 23, 2024

(54) METHOD FOR APPLYING A COATING TO A SURFACE OF A MULLITE MATERIAL, MULLITE MATERIAL HAVING A COATING, AND GAS TURBINE COMPONENT

(71) Applicant: Oerlikon Surface Solutions AG, Pfäffikon, Pfäffikon (CH)

(72) Inventors: Werner Stamm, Mülheim an der Ruhr (DE); Simone Friedle, Wuppertal (DE); Juergen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 381 days.

(21) Appl. No.: 17/613,426

(22) PCT Filed: May 19, 2020

(86) PCT No.: PCT/EP2020/000096
§ 371 (c)(1),
(2) Date: Nov. 22, 2021

(87) PCT Pub. No.: WO2020/233832
PCT Pub. Date: Nov. 26, 2020

(65) Prior Publication Data
US 2022/0213000 A1    Jul. 7, 2022

(30) Foreign Application Priority Data
May 20, 2019    (DE) ............ 10 2019 207 367.0

(51) Int. Cl.
C04B 41/45    (2006.01)
C04B 35/185   (2006.01)
(Continued)

(52) U.S. Cl.
CPC ........ *C04B 41/4529* (2013.01); *C04B 35/185* (2013.01); *C04B 41/0054* (2013.01); *C04B 41/4558* (2013.01); *C04B 41/5031* (2013.01); *C04B 41/5346* (2013.01); *C04B 41/87* (2013.01); *C04B 41/91* (2013.01);
(Continued)

(58) Field of Classification Search
CPC ... B32B 18/00; C04B 35/185; C04B 41/0054; C04B 41/4529; C04B 41/4558; C04B 41/5031; C04B 41/5046; C04B 41/87; C04B 41/91; C23C 14/0021; C23C 14/021
See application file for complete search history.

(56) References Cited

U.S. PATENT DOCUMENTS

2017/0121232 A1*  5/2017  Nelson ............. C23C 4/12

FOREIGN PATENT DOCUMENTS

| EP | 1780294 A1 | 5/2007 |
|----|------------|--------|
| WO | 2006099754 A1 | 1/2006 |
| WO | 2019053257 A1 | 3/2019 |

* cited by examiner

Primary Examiner — Zachary M Davis

(57) ABSTRACT

A method for applying a coating 1 to a surface 2 of a mullite material 3 is specified, which comprises pretreating the surface 2 of the mullite material 3 by means of a plasma-chemical process in which molecular hydrogen is excited in such a way that plasma-activated hydrogen is produced S1, and applying an aluminum oxide-containing layer 4 by means of a PVD process to the pretreated surface 2 of the mullite material 3 S2. Furthermore, a mullite material 3 with a coating and a gas turbine component with such a mullite material 3 are specified.

18 Claims, 4 Drawing Sheets

(51) Int. Cl.
*C04B 41/00* (2006.01)
*C04B 41/50* (2006.01)
*C04B 41/53* (2006.01)
*C04B 41/87* (2006.01)
*C04B 41/91* (2006.01)
*C23C 14/00* (2006.01)
*C23C 14/02* (2006.01)
*C23C 14/08* (2006.01)
*C23C 14/32* (2006.01)
*C23C 14/34* (2006.01)
*C23C 14/58* (2006.01)
*F02C 7/00* (2006.01)

(52) U.S. Cl.
CPC ........ *C23C 14/0021* (2013.01); *C23C 14/021* (2013.01); *C23C 14/081* (2013.01); *C23C 14/325* (2013.01); *C23C 14/34* (2013.01); *C23C 14/5853* (2013.01); *F02C 7/00* (2013.01); *C04B 2235/3463* (2013.01); *F05D 2220/32* (2013.01); *F05D 2230/31* (2013.01); *F05D 2230/90* (2013.01); *F05D 2300/2112* (2013.01)

METHOD FOR APPLYING A COATING TO A SURFACE OF A MULLITE MATERIAL, MULLITE MATERIAL HAVING A COATING, AND GAS TURBINE COMPONENT

The invention relates to a method for applying a coating to a surface of a mullite material, a mullite material with a coating and a gas turbine component.

In modern gas turbines, silicon and aluminum-containing materials are used in the area of the combustion chamber as combustion chamber bricks and also for other gas turbine components. These materials are usually referred to as mullite as a whole, although in addition to phases of actual mullite having the chemical composition 3 $(Al_2O_3) \times 2$ $(SiO_2)$, they also can contain phases of other $Al_2O_3$—$SiO_2$ compounds, but also phases of pure $Al_2O_3$ with a corundum structure ($\alpha$-$Al_2O_3$).

Figure 1:
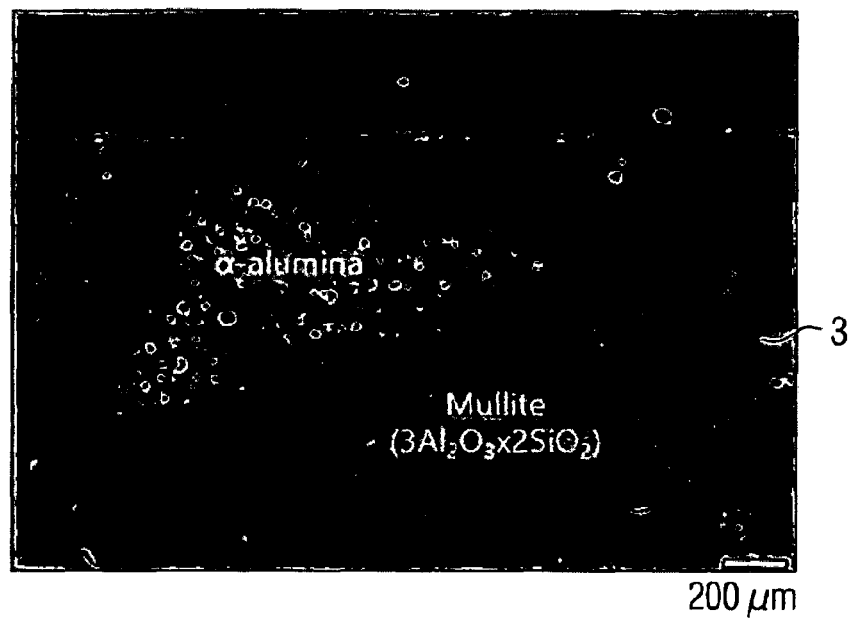

Furthermore, many ceramic fiber composite materials comprise fibers containing mullite. In the following, the term "mullite material" is therefore used for all materials containing $Al_2O_3$—$SiO_2$, right through to materials that consist almost exclusively of $Al_2O_3$. The term mullite material also includes so-called Ox-Ox materials, which are aluminum oxide-based ceramic matrix composite materials (CMCs). FIG. 1 shows a light microscope image of a polished section of a mullite material, in which different phases, which can occur in different grain sizes, are identified.

Another peculiarity of the mullite material, in addition to the different material phases, are the different grain sizes that are introduced or can arise during synthetic production by mixing the starting materials and high-temperature sintering.

The mullite material has excellent mechanical strength and chemical stability even at very high temperatures, as they can occur in the area of a combustion chamber of a turbine.

However, mullite materials have the disadvantage that they are attacked by hot water vapor, because, with the silicon contained in the mullite material, this can form volatile compounds. The consequence of this is that due to the loss of silicon from the surface, for example the combustion chamber bricks or another component made of mullite material, particles can be released from the mullite material because they lose their adhesion and become detached. Due to increased erosion, these detached particles wear the turbine blades and other components such as guide ring segments in the subsequent turbine area.

To prevent particle-related erosion on turbine components, thick protective layers can be sprayed on (EP 1 780 294 A1). However, even with a good bonding to the mullite material and good adhesion to the mullite material, these are detached by the high thermomechanical loads and fail after a relatively short period of operation. This applies in particular to protective layers which do not react chemically with the mullite material or whose coefficient of thermal expansion deviates significantly from the coefficient of thermal expansion of the mullite material.

The object of the present invention is to provide a coating method and a coating with which the disadvantages described above can at least be reduced.

This object is achieved by the subject-matters of the independent claims. The dependent claims contain embodiments of these solutions according to the invention.

An important reason for the poor adhesion to the mullite material or the bonding to the mullite material consists in the fact that the mullite material has different grain sizes and/or fibers as well as different phases, the difference in the phases exerting a particularly great influence. With the currently available materials and methods, the adhesion can only be optimized respectively with regard to one phase, e.g. with regard to $\alpha$-$Al_2O_3$ (corundum structure) or 3 $(Al_2O_3) \times 2$ $(SiO_2)$ (mullite structure), but not simultaneously with regard to several phases due to the different properties of the phases.

Another problem is the adaptation of the layer material to the mullite material in such a way that a chemical bond is made possible. The different phases of the mullite material also have a negative effect in this regard, since different chemical reactions would have to take place in each case.

Finally, in order to achieve good adhesion, the current application methods for the protective layers by means of spraying have a heating step which is intended to cause diffusion of elements in the boundary area between the mullite material and the sprayed-on protective layer. It is known, however, that at least one component of the mullite material, namely corundum, is a good diffusion barrier and thus prevents the common way of improving adhesion via a diffusion process.

The basic idea of the invention is therefore to pretreat the surface of the mullite material before the coating is applied in such a way that essentially only one material phase is still present on the surface. With regard to the properties of this material phase, the coating to be applied can be adapted in such a way that the best possible bonding or adhesion is achieved.

A method according to the invention for applying a coating to a surface of a mullite material comprises pretreating the surface of the mullite material by means of a plasma-chemical process in which molecular hydrogen is excited in such a way that plasma-activated hydrogen, e.g. atomic hydrogen and/or ionized hydrogen molecules, is produced and applying an aluminum oxide-containing layer by means of a PVD process on the pretreated surface of the mullite material.

With regard to the term "mullite material", reference is made to the definition introduced at the beginning. The mullite material represents the substrate, on the surface of which the coating is applied after pretreatment. The mullite material can in turn also represent a coating on another material.

In addition to the aluminum oxide-containing layer, the coating can have further layers, e.g. adhesive layers, top layers, thermal barrier layers. The aluminum oxide-containing layer is preferably applied directly, that is to say without intermediate layers, to the pretreated surface of the mullite material.

To pretreat the surface of the mullite material, it is subjected to a plasma-chemical process in a vacuum (pressure range between 0.001 mbar and 1 mbar, preferably between 0.05 mbar and 0.1 mbar). In this plasma-chemical process, molecular hydrogen is excited in such a way that atomic hydrogen and ionized hydrogen molecules are produced.

This plasma removes silicon very gently and only in the uppermost atomic layers of the mullite material from the silicon-containing phases of the mullite material by forming volatile Si—H compounds. These are then pumped out of the vacuum using a pump system. At the same time, impurities such as carbon, hydrocarbons or other elements on the pure Al—O— phases and in all other areas of the surface of the multi-material are removed and pumped out.

As a result of the pretreatment, a pretreated surface of the mullite material is obtained which essentially only has $\alpha$-$Al_2O_3$, that is aluminum oxide with a corundum structure.

Optionally, before the surface of the mullite material is pretreated by means of the plasma-chemical process, an infiltration of the surface can be carried out with an aluminum-containing material, e.g. YAG (yttrium aluminum garnet). As a result, the porosity of the surface can advantageously be reduced by at least partially filling existing pores with the aluminum-containing material. As a result of this infiltration, a more homogeneous surface is achieved, so that the subsequently applied aluminum oxide-containing layer cannot "break" into pores and the surface is better covered overall. In other words, the method according to the invention is also suitable for applying a coating to the surface of a material that has previously been infiltrated with an aluminum-containing material.

In a further process step, an aluminum oxide-containing layer is applied to the pretreated surface of the mullite material by means of a PVD process (PVD=physical vapor deposition), for example by means of an evaporation process, such as reactive cathodic spark evaporation, or sputtering.

Both PVD processes use a target from which material is removed and deposited on the surface of the mullite material. The target comprises aluminum and optionally other elements, such as chromium, titanium, hafnium, yttrium, erbium, silicon and/or zirconium, which should be included in the layer to be applied. By carrying out the PVD process in a reactive oxygen-containing environment, there is an oxidation of the aluminum and possibly of the other elements, so that consequently an aluminum oxide-containing layer is deposited. Alternatively, the aluminum oxide-containing layer can be applied by an aluminum oxide-containing target by means of high-frequency sputtering.

The aluminum oxide-containing layer is preferably applied to the pretreated surface of the mullite material by means of reactive cathodic spark evaporation, the target material being evaporated, which is connected as the cathode in the spark evaporation. The evaporation takes place in a vacuum under controlled oxygen partial pressure, which can be set by a corresponding oxygen gas flow.

The aluminum oxide-containing layer is preferably applied to the pretreated surface of the mullite material at a substrate temperature in the range between 550° C. and 650° C., particularly preferably at a substrate temperature of 600° C. However, the temperature can also be lowered below 300° C. or the layer can also be applied at higher temperatures.

The mentioned PVD processes advantageously enable the application of a homogeneous aluminum oxide-containing layer in just one process step. In addition, the preferred layer thicknesses in the range between 0.5 µm and 50 µm can be achieved with high accuracy. The reactive cathodic spark evaporation is also characterized by a high level of robustness. There is normally no need for any special regulation to avoid target poisoning. In addition, the metallic vapor that is generated during reactive cathodic spark evaporation is ionized to a high degree, which contributes to well-adhering layers.

The boundary area produced by the method between the mullite material and the aluminum oxide-containing layer has spike-like structures made of an aluminum oxide-containing material, preferably aluminum oxide, whereby the adhesion or binding of the aluminum oxide-containing layer on the mullite material is improved.

The target preferably also has the metal chromium. For example, a target with an element distribution of 70/30 (Al/Cr) can be used. The proportion of chromium in the target promotes the formation of a corundum structure in a forming Al—Cr—O mixed crystal, even at relatively low temperatures of 500° C. and below. By varying the chromium content in the target, the lattice constant of the Al—Cr—O mixed crystal structure in the aluminum oxide-containing layer to be applied can be adapted in a range between corundum and eskolaite. The corundum structure is characterized by high thermal stability.

In this respect the Vegard's rule can be applied, according to which the lattice constant of a crystal is linearly dependent on the percentage of the components.

The Al—Cr—O mixed crystal structure can exist in various crystallite sizes, which are influenced by the process conditions of the PVD process, e.g. the chromium content in the target, oxygen partial pressure, substrate temperature and which can be controlled accordingly. This has the consequence that the applied aluminum oxide-containing layer, depending on the process conditions, can be, for example, X-ray amorphous or can clearly show the corundum structure in an X-ray analysis, the positions of the Bragg peaks corresponding to the chromium content being between those of pure corundum and those of escolaite.

The aluminum oxide-containing layer is preferably applied as an essentially single-phase layer, e.g. as mixed crystal in corundum structure. This has the advantage that the layer properties are homogeneous so that the protective effect of the layer can last over a longer period of time. Above all, the mixed crystal structure is thermally stable.

More preferably, the crystal structure of the single-phase layer containing aluminum oxide corresponds to the corundum structure or transitions into the corundum structure at higher temperatures. If the aluminum oxide-containing layer also contains chromium, this is preferably applied as a single-phase layer with a corundum mixed crystal structure.

In addition, the aluminum oxide-containing layer can have metallic macroparticles, so-called droplets, which can arise, for example, during reactive cathodic spark evaporation. When using a chromium-containing target, the macroparticles can have a higher chromium content than the target; that means that chromium accumulates in the macroparticles. The droplets can transition directly into the mixed crystal upon oxidation. This oxidation process can advantageously close any grain boundaries.

According to various embodiments, the aluminum oxide-containing layer can comprise chromium, titanium, hafnium, yttrium, erbium, silicon and/or zirconium. The aluminum oxide-containing layer can preferably comprise chromium. For this purpose, the elements mentioned can be present in the target that is used to apply the layer. Other elements can also be included to promote certain properties.

Regarding the optional component chromium, reference is made to the above explanations. The elements can be used, for example, to adapt the layer properties to the mullite material to be coated or to influence other layer properties.

If an essentially single-phase layer is to be applied to the surface of the mullite material, the solubility limit of the said additional elements in aluminum should not be significantly exceeded. In other words, the proportion of the elements can be so high that their solubility limit in aluminum is approximately reached, but not exceeded, or at most slightly exceeded.

Alternatively, the proportions of the additional elements can also be higher in order to adapt the properties of the material to specific requirements, e.g. in order to adapt the thermal expansion coefficients of the layer to be applied and of the substrate material to one another.

The aluminum oxide-containing layer can be applied with a layer thickness between 0.5 µm and 50 µm. The thickness can be selected, for example, as a function of the quality, such as roughness, of the surface of the mullite material so that the properties of the coated mullite material can be improved.

According to further embodiments, the method can include a heat treatment of the applied aluminum oxide-containing layer at a temperature in the range between 900° C. and 1400° C. for a duration between 15 min and 60 min, for example at a temperature of approx. 1200° C. for approx. 30 min.

Lower temperatures require longer exposure times. The heat treatment can improve the bonding of the applied layer to the substrate. If the applied layer contains chromium, diffusion of the chromium to the layer surface and evaporation of the chromium oxide that is formed can also occur.

This process leaves fine pores, which significantly increase the expansion tolerance of the layer.

As an alternative to heat treatment, the applied aluminum oxide-containing layer can be post-treated by means of an oxygen plasma. In other words, the applied layer can be plasma oxidized in an oxygen atmosphere, the oxygen being activated by the plasma. Such a post-treatment can be advantageous directly after the application of the aluminium oxide containing layer on the surface of the mullite material without the vacuum having to be interrupted. As a result, such post-treatment can be carried out quickly and inexpensively.

Another aspect of the invention relates to a mullite material with an aluminum oxide-containing layer arranged on a surface of the mullite material, spike-like structures with tips directed into the aluminum oxide-containing layer being formed in a boundary area between the mullite material and the aluminum oxide-containing layer.

The mullite material of the present invention can be obtained, for example, by the method explained above. The spike-like structures have a substantially triangular shape in cross section (parallel to the layer thickness), e.g. the shape of an isosceles triangle. When viewed three-dimensionally, a spike-like structure can, for example, have approximately the geometry of a cone with a substantially circular base. The substantially triangular shape can be detected, for example, by means of scanning electron microscope images or transmission electron microscope images after sample preparation that is customary in the art.

The spike-like structures essentially begin at the boundary area between the mullite material and the aluminum oxide-containing layer, i. e. the surface of the mullite material before coating, and taper as the thickness of the aluminum oxide-containing layer increases, i.e. a tip directed into the aluminium oxide-containing layer is formed. Typical dimensions of a spike-like structure are a width b (measured parallel to the boundary area between the mullite material and the aluminum oxide-containing layer) between 50 nm and 200 nm and a height h (measured parallel to the layer thickness of the aluminum-containing layer) between 100 nm and 500 nm. The dimensions can be determined, for example, by evaluating scanning electron microscope images or transmission electron microscope images.

The spike-like structures result in a very good bonding between the aluminum oxide-containing layer and the mullite material. As a result, the coated mullite material is characterized by a very high thermal stability and a long service life. It can therefore be used advantageously for high temperature applications, e.g. in the field of gas turbines.

The aluminum oxide-containing layer acts as a protective layer so that the mullite material can no longer be attacked by hot water vapor. This makes it possible to prevent the release of particles from the surface and consequently an erosion caused by the released particles.

The spike-like structures preferably have an aluminum-containing material or consist of aluminum oxide. This ensures a particularly good adhesion or bonding between the mullite material and the aluminum oxide-containing layer.

The layer thickness of the aluminum oxide-containing layer can be between 0.5 µm and 50 µm, preferably between 5 µm and 20 µm. With a layer thickness in this range, particularly good protection of the mullite material under high temperatures can be achieved.

According to various embodiments, the aluminum oxide-containing layer is essentially single-phase. In addition, the aluminum oxide-containing layer can have metallic macroparticles. Furthermore, the aluminum oxide-containing layer can comprise chromium, titanium, hafnium, yttrium, erbium, silicon and/or zirconium. With regard to these embodiments, reference is made to the explanations and advantages mentioned above with regard to the method.

Another aspect of the invention relates to a gas turbine component, e.g. a combustion chamber brick, with a mullite material according to the invention. The gas turbine component can be part of a gas turbine. In the area of gas turbine components, the use of the mullite material according to the invention has a particularly advantageous effect, since otherwise damage caused by particle-related erosion can lead to long downtimes and high repair costs. Maintenance intervals can be shortened, since the gas turbine component according to the invention has a longer service life than a gas turbine component without the mullite material according to the invention.

Figure 2:
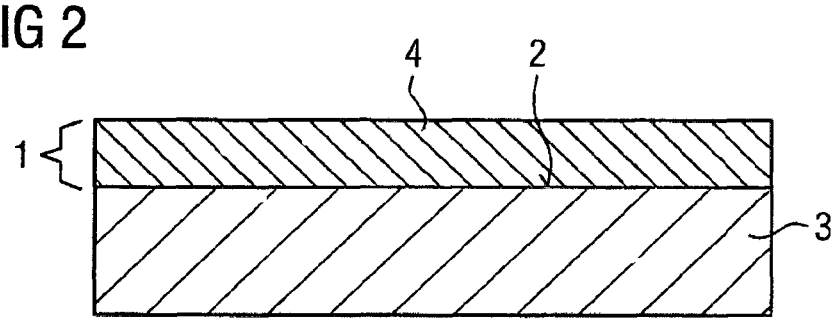
Figure 3:
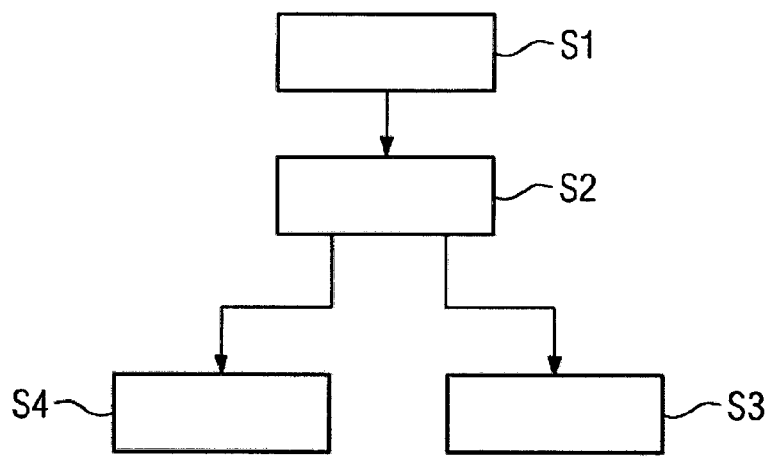
Figure 4:
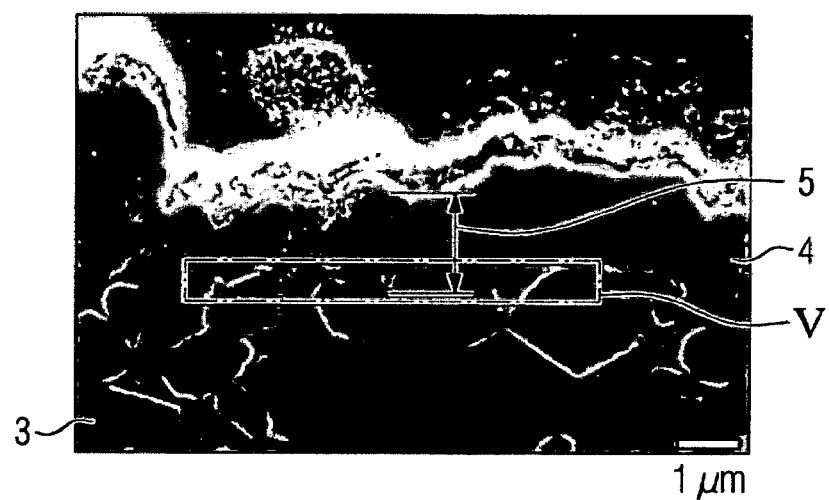
Figure 5:
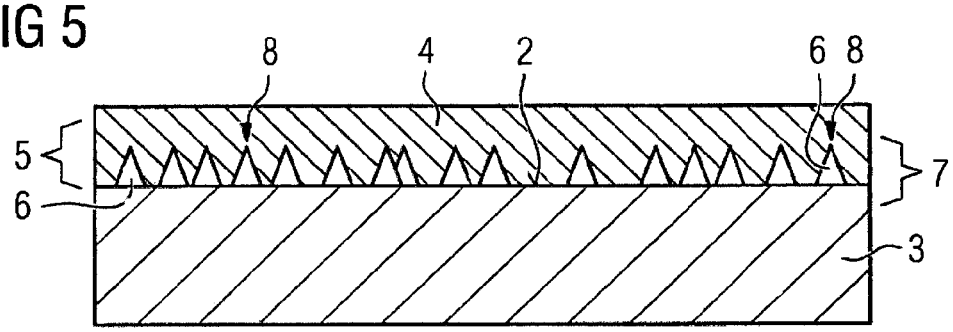
Figure 6:
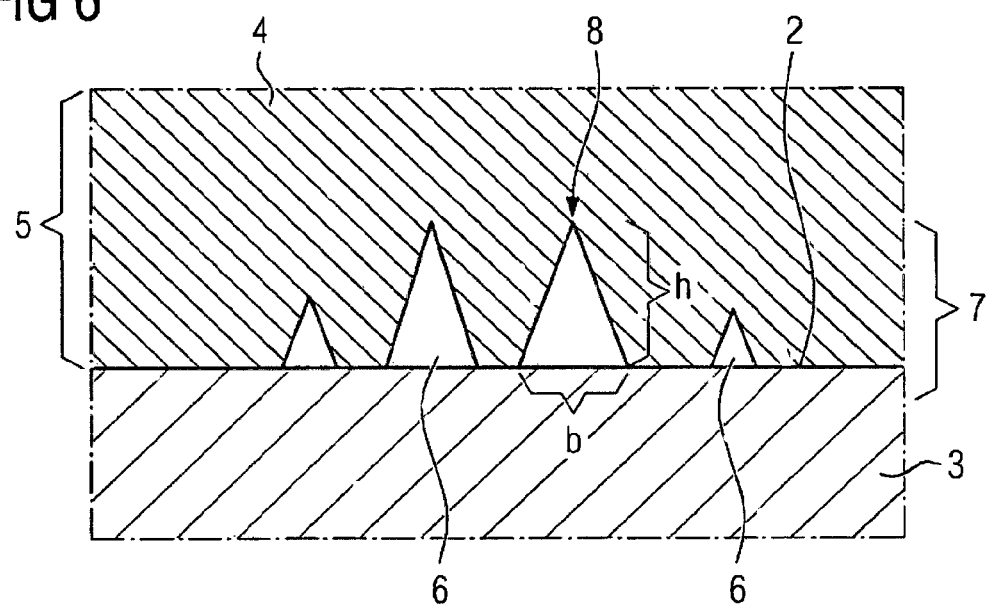
Figure 7:
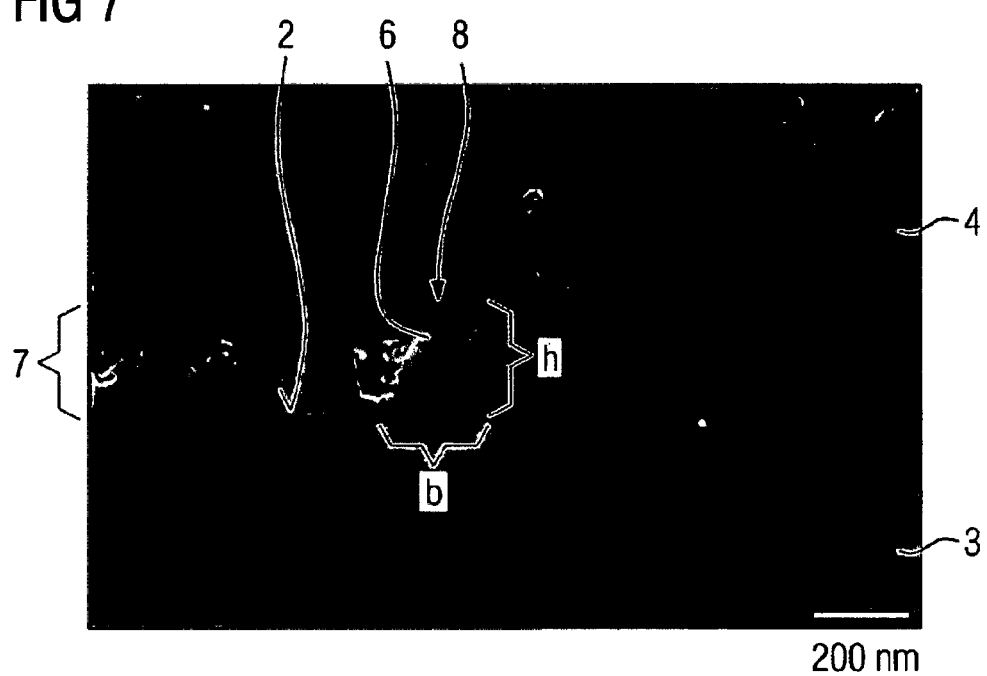

The invention is explained in more detail below with reference to the figures and the associated description. It is shown in:

FIG. 1: an optical microscope image of a polished section of a mullite material;

FIG. 2: a schematic representation of a coated mullite material;

FIG. 3: an exemplary flow diagram of a coating process;

FIG. 4: a scanning electron microscope image of a polished section of a mullite material with coating (low magnification);

FIG. 5: a schematic representation of the boundary area between mullite material and coating in cross section;

FIG. 6: a schematic representation of the proportions of the spike-like structures in cross section; and FIG. 7: a scanning electron microscope image of a polished section of a mullite material with a coating (high magnification).

FIG. 1 shows an optical microscope image of a polished section of a mullite material 3, in which different phases, which can occur in different grain sizes, are designated. The triangular formation of a phase with a corundum structure, referred to as "α-alumina" in FIG. 1, and an elongated phase with a mullite structure, referred to as "mullite (3 $Al_2O_3 \times 2SiO_2$)" in FIG. 1, can be seen there. As already mentioned, such a material as a whole is referred to as a mullite material 3. The mullite material 3 can be used, for example, to manufacture combustion chamber bricks for a gas turbine.

In FIG. 2, a coated mullite material 3 is shown schematically, as it can be obtained with the method according to the invention. An aluminum oxide-containing layer 4 forming the coating 1 is arranged directly on the surface 2 of the mullite material 3 that has been pretreated by means of a plasma-chemical process. The coating 1 can optionally have further layers (not shown in FIG. 2).

The aluminum oxide-containing layer 4 can consist, for example, of aluminum oxide. However, it can also contain other elements, such as chromium. The aluminum oxide-containing layer 4 was applied by means of a PVD process, preferably by means of reactive cathodic spark evaporation.

With reference to FIG. 3, a method for applying a coating 1 to a surface 2 of a mullite material 3 is explained below.

In a first method step S1, the surface 2 of the mullite material 3 is pretreated. For this purpose a plasma-chemical process is used, in which molecular hydrogen is excited in such a way that plasma-activated hydrogen is produced, which acts on the surface 2. As a result, silicon is removed from the uppermost atomic layers of phases containing silicon so that a surface 2 is produced, which essentially contains only $\alpha$-$Al_2O_3$ in different grain sizes.

Specifically, the pretreatment can be carried out, for example, as described below. First, the substrate is introduced into a coating chamber with a coating device. To generate the plasma-activated hydrogen (reactive hydrogen plasma), the coating chamber contains, in addition to a coating device, a further device with which an arc discharge can be generated and which consists of a cathode and an anode.

Depending on the application, the anode can be isolated from the coating chamber, i.e. also isolated from ground (or earth), or at the same potential as the coating chamber, or the anode can be realized by the conductive substrate holder. The arc discharge is operated with a noble gas, typically argon. This is introduced into the space between the cathode and anode, preferably near the cathode, and the flow of argon is chosen so that a pressure between $1 \times 10^{-4}$ mbar and $1 \times 10^{-2}$ mbar is produced in the coating chamber. The arc discharge is then ignited by a suitable ignition device. Such an arc discharge is characterized by high discharge currents (10 A-400 A) and low discharge voltages (20V-40V).

After the arc discharge has been ignited, the reactive gas to be activated, namely hydrogen, is added to it, the flow of the hydrogen gas being selected so that a total pressure of between $5 \times 10^{-3}$ mbar and $5 \times 10^{-2}$ mbar is produced in the coating chamber. In the arc discharge, the added hydrogen gas is dissociated, atomized, excited and ionized. This creates very reactive hydrogen, which can react with elements of the substrate surface to be coated and form gaseous, volatile compounds with elements such as Si or C, which compounds can be pumped off.

The result of this surface pretreatment in the hydrogen plasma is a surface from which both silicon, which is in the surface of the mullite material, and undesirable carbon-based impurities are removed. The cleaning depth of such a process is limited to the penetration depth of the activated hydrogen, i.e. to typical penetration depths in the range of 10 nm-100 nm. These modifications of the surface close to the substrate are of course not sufficient to achieve, for example, permanent protection against the volatilization of silicon under water vapor at high temperatures (over 1000° C.).

It is necessary that, after the hydrogen plasma treatment, the mullite material is protected by an additional layer, which is inert to reactive hydrogen.

In a subsequent method step S2, an aluminum oxide-containing layer 4 is therefore applied to the pretreated surface 2. The coating is preferably carried out directly after the pretreatment in the same coating chamber and without interrupting the vacuum. A PVD process, e.g. reactive cathodic spark evaporation or sputtering, is used for the coating.

After method step S2, the applied aluminum oxide-containing layer 4 can be post-treated. There are two ways of doing this. Either the aluminum oxide-containing layer 4 is subjected to a heat treatment in process step S3, e.g. for 30 min at 1200° C., or the aluminum oxide-containing layer 4 is oxidized in process step S4 by means of an oxygen plasma.

FIG. 4 shows a scanning electron microscope image of a polished section of an exemplary mullite material 3 with an aluminum oxide-containing layer 4, which has been applied to the surface 2 of the mullite material 3 by means of reactive cathodic spark evaporation. The layer thickness 5 is about 2 $\mu$m. The white area above the aluminum oxide-containing layer 4 was caused by over-exposure of the boundary area (due to the substrate preparation), when the scanning electron microscope image was produced, and has no physical significance.

FIG. 5 shows the area outlined in black in FIG. 4 in the boundary area 7 between the mullite material 3 and the aluminum oxide-containing layer 4 in a schematic, enlarged view. Spike-like structures 6, which essentially consist of aluminum oxide and whose tips 8 are directed into the aluminum oxide-containing layer 4, can be clearly seen.

The spike-like structures 6 lead to a significantly improved bonding or adhesion between the mullite material 3 and the aluminum oxide-containing layer 4.

FIG. 6 illustrates the proportions of the spike-like structures 6. Spike-like structures 6 can be seen in the boundary area 7 between the mullite material 3 and the aluminum oxide-containing layer 4, which begin at the boundary area between the mullite material 3 and the aluminum oxide-containing layer 4, which corresponds to the surface 2 before the coating, and the tips 8 of which are directed into the aluminum oxide-containing layer 4. In the cross section shown, the spike-like structures 6 essentially have the shape of isosceles triangles. The width b of a spike-like structure 6 is between 50 nm and 200 nm, while the height h is between 100 nm and 500 nm. The layer thickness 5 of the aluminum oxide-containing layer 4 can be, for example, approximately 1.5 $\mu$m.

FIG. 7 shows a scanning electron microscope image of a mullite material 3 with an aluminum oxide-containing layer 4 arranged on the surface 2. The aluminum oxide-containing layer 4 is essentially single-phase and, in addition to aluminum and oxygen, also contains chromium.

In the boundary area 7 between the mullite material 3 and the aluminum oxide-containing layer 4, spike-like structures 6 can be seen which begin at the boundary area between the mullite material 3 and the aluminum oxide-containing layer 4 or the surface 2. The tips 8 of the spike-like structures 6 are directed into the aluminum oxide-containing layer 4. The width b of a spike-like structure 6 is between 50 nm and 200 nm, while the height h is between 100 nm and 500 nm.

The invention claimed is:

1. A method for applying a coating to a surface of a mullite material comprising:
    pre-treating the surface of the mullite material using a plasma-chemical process in which molecular hydrogen is excited in such a way that plasma-activated hydrogen is produced, and
    applying an aluminum oxide-containing layer on the pretreated surface of the mullite material using a PVD process.

2. The method according to claim 1, wherein the pretreatment is carried out using the plasma-chemical process in such a way that silicon is removed from silicon-containing phases of the surface of the mullite material.

3. The method according to claim 1, wherein the pretreatment using the plasma-chemical process is carried out in such a way that the pretreated surface of the mullite material comprises α-$Al_2O_3$.

4. The method according to claim 1, wherein the plasma-chemical process is carried out at a total pressure between $5 \times 10^{-3}$ mbar and $5 \times 10^{-2}$ mbar.

5. The method according to claim 1, wherein the PVD process is reactive cathodic spark evaporation or sputtering.

6. The method according to claim 1, wherein the aluminum oxide-containing layer is applied as an essentially single-phase layer.

7. The method according to claim 1, wherein the aluminum oxide-containing layer is deposited as a layer with metallic macroparticles.

8. The method according to claim 1, wherein the aluminum oxide-containing layer comprises at least one of the group consisting of chromium, titanium, hafnium, yttrium, erbium, silicon and zirconium.

9. The method according to claim 1 further comprising:
heat treating the applied aluminum oxide-containing layer at a temperature in the range between 900° C. and 1400° C. for a time period between 15 min and 60 min.

10. The method according to claim 1 further comprising:
oxidizing the applied aluminum oxide-containing layer using an oxygen plasma.

11. The method according to claim 1 further comprising:
infiltrating the surface of the mullite material with an aluminum-containing material before pretreating the surface of the mullite material using the plasma-chemical process.

12. A mullite material comprising an aluminum oxide-containing layer arranged on a surface of the mullite material, wherein spike-like structures with tips directed into the aluminum oxide-containing layer are formed in a boundary area between the mullite material and the aluminum oxide-containing layer wherein the spike-like structures have a width b between 50 nm and 200 nm and a height h of between 100 nm and 500 nm.

13. The mullite material according to claim 12, wherein the spike-like structures comprise an aluminum oxide-containing material or consist of aluminum oxide.

14. The mullite material according to claim 12, wherein a layer thickness of the aluminum oxide-containing layer is between 0.5 μm and 50 μm.

15. The mullite material according to claim 12, wherein the aluminum oxide-containing layer is essentially single-phase.

16. The mullite material according to claim 12, wherein the aluminum oxide-containing layer comprises metallic macroparticles.

17. The mullite material according to claim 12, wherein the aluminum oxide-containing layer comprises at least one of the group consisting of chromium, titanium, hafnium, yttrium, erbium, silicon and zirconium.

18. A gas turbine component comprising the mullite material according to claim 12.

\* \* \* \* \*